US009570446B1

(12) United States Patent
Woo et al.

(10) Patent No.: US 9,570,446 B1
(45) Date of Patent: Feb. 14, 2017

(54) SEMICONDUCTOR DEVICE

(71) Applicants: Hyo Seok Woo, Hwaseong-si (KR); In Mo Kim, Hwaseong-si (KR); Bora Lee, Incheon (KR); Sun Young Kim, Seongnam-si (KR); Hoo Sung Cho, Yongin-si (KR)

(72) Inventors: Hyo Seok Woo, Hwaseong-si (KR); In Mo Kim, Hwaseong-si (KR); Bora Lee, Incheon (KR); Sun Young Kim, Seongnam-si (KR); Hoo Sung Cho, Yongin-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 14/974,275

(22) Filed: Dec. 18, 2015

Related U.S. Application Data

(60) Provisional application No. 62/238,873, filed on Oct. 8, 2015.

(30) Foreign Application Priority Data

Nov. 18, 2015 (KR) .................. 10-2015-0161616

(51) Int. Cl.
H01L 23/48 (2006.01)
G01R 31/28 (2006.01)
H01L 23/485 (2006.01)
G01R 1/067 (2006.01)
H01L 27/105 (2006.01)
H01L 23/00 (2006.01)
H01L 23/522 (2006.01)
H01L 21/66 (2006.01)

(52) U.S. Cl.
CPC .......... *H01L 27/1052* (2013.01); *H01L 22/32* (2013.01); *H01L 23/5226* (2013.01); *H01L 24/09* (2013.01); *H01L 2224/08055* (2013.01); *H01L 2224/09055* (2013.01)

(58) Field of Classification Search
CPC .......... H01L 23/52; H01L 2224/02122; H01L 22/34; H01L 22/00; H01L 24/02; H01L 2924/35121; H01L 2924/14; H01L 24/05; H01L 24/03; H01L 2221/6834; H01L 2223/5448; H01L 2224/05553; H01L 22/14; H01L 23/31; H01L 23/49503
USPC .......................................... 361/48
See application file for complete search history.

(56) References Cited

U.S. PATENT DOCUMENTS 7,323,894 B2 1/2008 Choi et al.
7,880,493 B2 2/2011 Kim et al.
7,999,370 B2 8/2011 Lee
(Continued)

FOREIGN PATENT DOCUMENTS

KR 10-2006-0078913 A 7/2006
KR 10-2009-0032174 A 4/2009

*Primary Examiner* — Caridad Everhart
(74) *Attorney, Agent, or Firm* — Lee & Morse, P.C.

(57) ABSTRACT

A semiconductor device includes a plurality of semiconductor devices, a plurality of metal lines electrically connected to at least one of the semiconductor devices, and a protective layer on the metal lines. The protective layer includes a plurality of open areas partially exposing the metal lines and which serves as pads. A first pad includes a first area that extends from at least one of the metal lines and at least one second area around and separated from the first area.

9 Claims, 12 Drawing Sheets

(56) References Cited

U.S. PATENT DOCUMENTS

| | | |
|---|---|---|
| 8,624,619 B2 | 1/2014 | Chang |
| 9,134,367 B2 | 9/2015 | Pagani |
| 2003/0184333 A1* | 10/2003 | Nagel ................... H01L 24/03 324/750.3 |
| 2003/0229831 A1 | 12/2003 | Jeon |
| 2007/0018340 A1 | 1/2007 | Kim et al. |
| 2011/0140730 A1* | 6/2011 | Zieren ................. G01R 31/048 324/762.03 |
| 2012/0068725 A1* | 3/2012 | Pagani ................... H01L 22/34 324/750.16 |
| 2014/0320156 A1 | 10/2014 | Kim |
| 2016/0178666 A1* | 6/2016 | Oh ..................... G01R 1/06794 324/750.24 |

* cited by examiner

SEMICONDUCTOR DEVICE

CROSS-REFERENCE TO RELATED APPLICATION

This U.S. Non-Provisional application claims benefit to U.S. Provisional Application No. 62/238,873, filed on Oct. 8, 2015, and also claims priority to Korean Patent Application No. 10-2015-0161616, filed on Nov. 18, 2015, and entitled: "Semiconductor Device," both of which are incorporated by reference herein in their entirety.

BACKGROUND

1. Field

One or more embodiments described herein relate to a semiconductor device.

2. Description of the Related Art

One goal of system designers is to reduce the size of semiconductor devices and at the same time increase their ability to process high capacity data. This may involve increasing their degree of integration. Semiconductor devices usually include pads for receiving electrical signals. At least one of these pads may be used as a sensor pad for verifying an alignment state of a probe.

SUMMARY

In accordance with one or more embodiments, a semiconductor device includes a substrate; a plurality of semiconductor devices on the substrate; a plurality of metal lines electrically connected to at least one of the semiconductor devices; and a protective layer on the metal lines and including a plurality of open areas partially exposing the metal lines to provide a plurality of pads, wherein a first pad includes a first area that extends from at least one of the metal lines and at least one second area around and separated from the first area.

The at least one second area may include a plurality of second areas, and the second areas may be separated from each other and arranged around the first area. The first area may include a pad area and at least one connection area extending from and connecting the pad area to at least portions of the metal lines. A size of the pad area may be greater than a size of the connection area. The pad area may have a tetragonal shape, and the at least one connection area may include a plurality of connection areas which extend from edges of the pad area opposing each other and in different directions to each other. A size of the first area may be greater than a size of the second area.

The plurality of metal lines may include a plurality of first metal lines and a plurality of second metal lines on the plurality of first metal lines. The first area may be connected to at least one of the second metal lines. The second area may be connected to at least one of the first metal lines by at least one via. The second area may be disposed along an edge of the open area.

At least a portion of the at least one second area may be exposed by at least one of the open areas, and another portion of the at least one second area may be blocked by the protective layer. The semiconductor device may include a switching circuit connected to the first pad; and first and second circuits connected to the switching circuit, wherein an output node of the first circuit is connected to a second pad different from the first pad. The first circuit may output a verifying voltage to the second pad in order to verify an alignment state of probes in contact with the pads.

The switching circuit may transmit a voltage supplied to the first pad to the first circuit when a probe is in contact with the first pad. The switching circuit may transmit the voltage supplied to the first pad to the second circuit when a predetermined reference voltage is not detected from the second pad when the switching circuit transmits the voltage supplied to the first pad to the first circuit.

In accordance with one or more other embodiments, a semiconductor device includes a substrate; a plurality of memory cells including: channel areas extending in a direction crossing an upper surface of the substrate, and plurality of gate electrode layers stacked on the substrate adjacent to the channel areas; a plurality of circuits around the memory cells; a plurality of metal lines electrically connected to at least a portion of the memory cells, channel areas, or the circuits; and a protective layer on the metal lines and providing a plurality of pads, the pads corresponding to exposed portions of the metal lines, wherein the pads include a first pad having a first area connected to at least one of the metal lines and a second area around and electrically isolated from the first area.

The pads may include a second pad different from the first pad, and the second pad may have a different shape from the first pad. The metal lines may include first metal lines and second metal lines on the first metal lines, and the pads may be between the second metal lines. The first area may be electrically connected to the second metal line.

In accordance with one or more other embodiments, a semiconductor device includes a cell region including a plurality of memory cells; a peripheral circuit region including a plurality of circuits to drive the memory cells; and a plurality of pads to supply electrical signals to the cell region and the peripheral circuit region, the pads including a first pad and a second pad having different shapes, wherein the first pad includes: a first area to serve as a pad to supply an electrical signal to at least one of the cell region or the peripheral circuit region, and a second area to serve as a sensor pad to detect an alignment state of a probe in contact with at least one of the pads.

In accordance with one or more other embodiments, a pad arrangement includes a first pad; and a second pad having a shape different from the first pad, wherein the first pad serves as a pad to supply a signal to a circuit and the first pad is to supply a signal to the circuit or another circuit and is to serve as a sensor test pad. The first pad may include a first area to supply the electrical signal to the circuit or another circuit, and a second area to transmit a predetermined signal to allow for detection of an alignment state of a probe in contact with at least one of the first pad or the second pad. The first and second pads may correspond to respective ones of a plurality of metal lines, and each of the metal lines may have a first portion covered by a protective layer and an exposed portion not covered by the protective layer. The second area may be adjacent to and spaced from the first area. The first area may be larger than the second area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
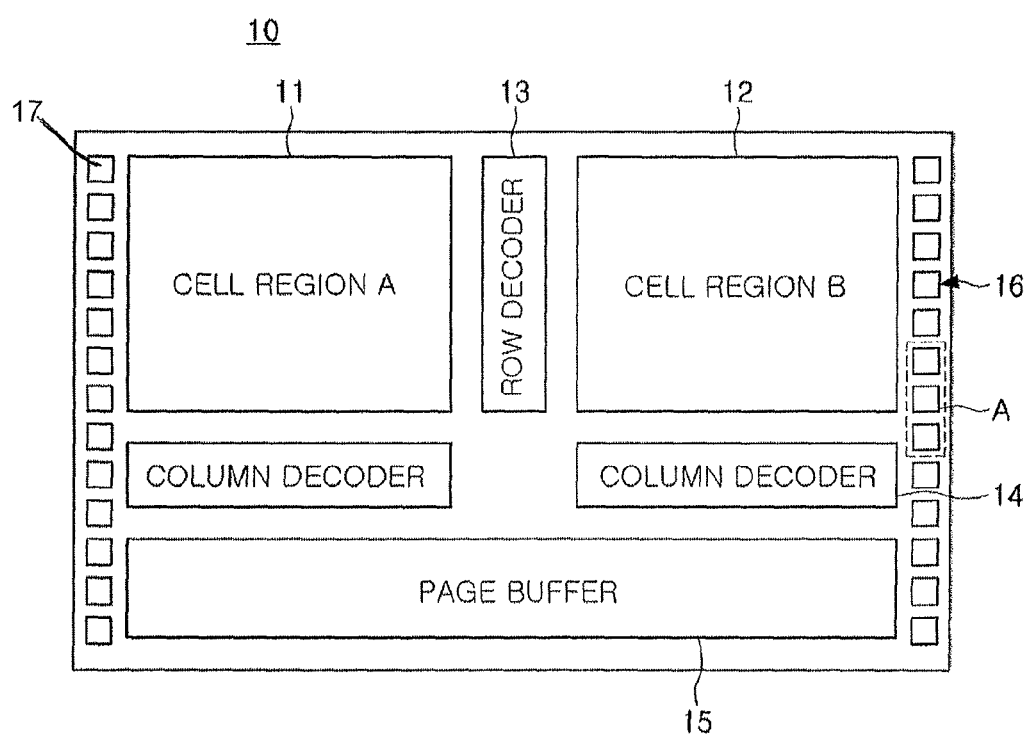
FIG. 1 illustrates a layout embodiment of a semiconductor device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the embodiments described herein. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

In the drawings, for example, due to manufacturing techniques and/or tolerances, modifications of the shape shown may be estimated. Thus, embodiments should not be construed as being limited to the particular shapes of regions shown herein, for example, to include a change in shape results in manufacturing. The following embodiments may also be constituted as one or a combination thereof.

FIG. 1 illustrates an embodiment of a semiconductor device 10 which may be a memory device including cell regions 11 and 12 having memory cells for storing data. The cell regions 11 and 12 may include a plurality of regions. A row decoder 13 and a column decoder 14 may be adjacent to the cell regions 11 and 12. The column decoder 14 may include or be connected to a page buffer 15 and a read/write circuit. Operations of the semiconductor device 10 may be controlled by a control circuit. The row decoder 13, the column decoder 14, and the page buffer 15, except the cell regions 11 and 12, may be included in a peripheral circuit region.

In some exemplary embodiments, the semiconductor device 10 may be a memory device having a horizontal structure or a vertical structure. The cell regions 11 and 12 may include a plurality of memory cells having channel areas, gate electrode layers, gate insulating layers, and the like. The memory cell devices in the cell regions 11 and 12 may be connected to the row decoder 13 via a word line WL, a common source line CSL, a string select line SSL, a ground select line GSL, and/or another type of signal line, and may be connected to the column decoder 14 via a bit line BL.

The row decoder 13 may receive address information ADDR from an external device, decode the received address information ADDR, and select one or more of the word line WL, the common source line CSL, the string select line SSL, and/or the ground select line GSL connected to the cell regions 11 and 12.

The column decoder 14 may select one or more of the bit lines BL connected to the cell regions 11 and 12 according to a command from the control circuit. The column decoder 14 and the page buffer 15 may read data stored in memory cells connected to the selected portion of the bit lines BL, and/or may write data to memory cells connected to the selected portion of the bit lines BL.

The control circuit may control operations of the row decoder 13, the column decoder 14, and the page buffer 15 in response to a control signal from an external device. When data stored in the cell regions 11 and 12 is read, the control circuit may control operations of the row decoder 13 in order to supply a voltage for the reading operation to a word line WL for storing read data. When the voltage for the reading operation is supplied to a specific word line WL, the control circuit may control the column decoder 14 and the page buffer 15 to read data stored in a memory cell device connected to the word line WL, to which the voltage for the reading operation is supplied.

When data is to be written to the cell regions 11 and 12, the control circuit may control operations of the row decoder 13 in order to supply a voltage for the writing operation to a word line WL for writing data. When the voltage for the writing operation is supplied to a specific word line WL, the control circuit may control the column decoder 14 and the page buffer 15 to write the data to a memory cell device connected to the word line WL, to which the voltage for the writing operation is supplied.

A plurality of pads 16 may be arranged on one or more edge portions of the semiconductor device 10. The pads 16 may be provided by exposing at least a portion of a plurality of metal lines of the semiconductor device 10. Electrical signals for operating the memory cells in the cell regions 11 and 12 and circuit elements in the peripheral circuit region may be supplied through the pads 16.

In a test process performed after the semiconductor device 10 is fabricated, electrical signals for testing the semiconductor device 10 may be applied through one or more probes that contact the pads 16. In order to achieve an accurate test of the semiconductor device 10, the probes may be properly aligned with respective ones of the pads 16. A circuit in the semiconductor device 10 may then inspect an alignment state of the probes. For example, a single one of the pads 16 may be used to verify the alignment state of the probes during a test, and may also function as a normal pad.

Figure 2A:
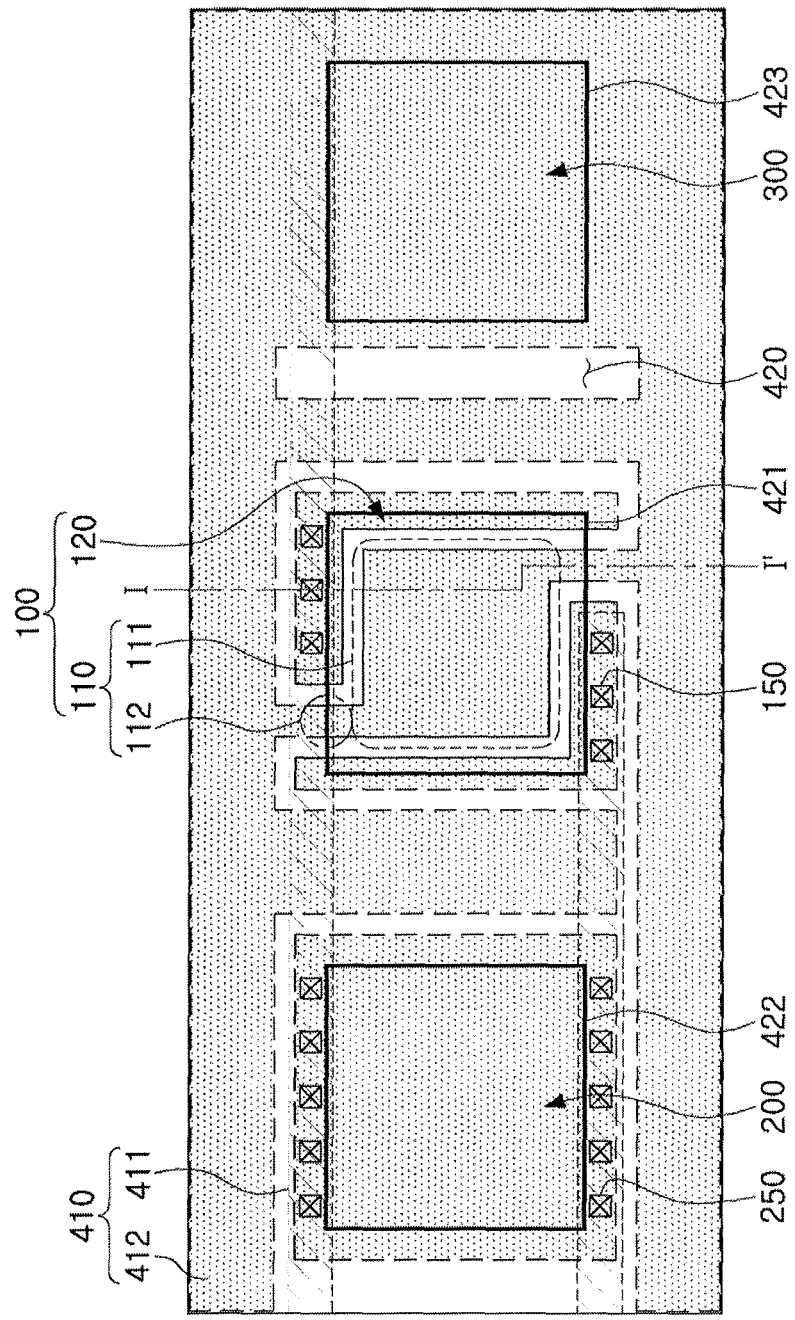
FIG. 2A illustrates an embodiment of a pad area of the semiconductor device.
Figure 2B:
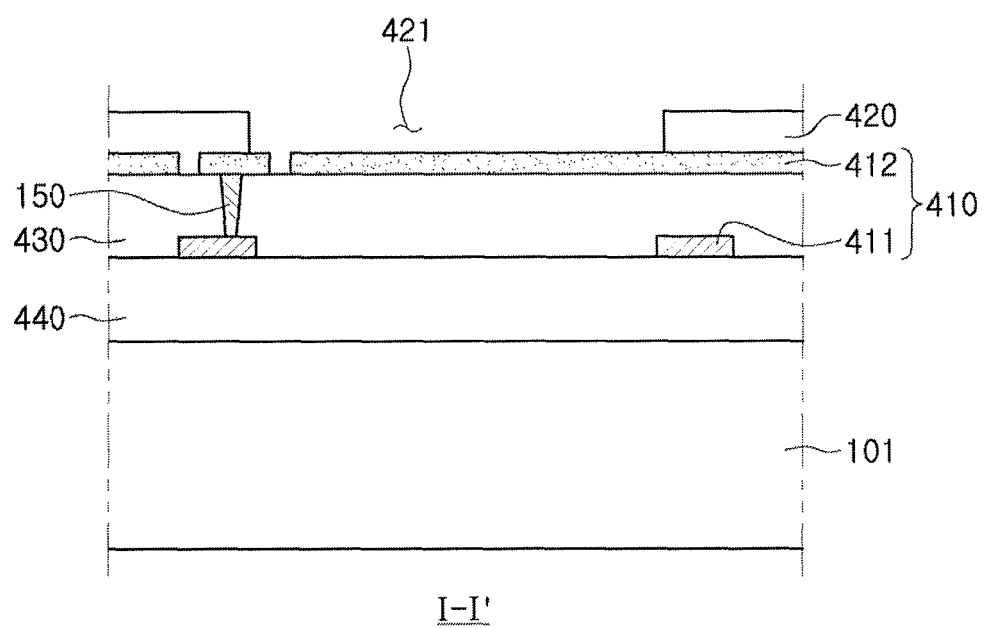
FIG. 2B illustrates a view along section line I-I' in FIG. 2A.

FIG. 2A is a partially enlarged view of one embodiment of a pad region A of the semiconductor device 10, and FIG. 2B is a cross-sectional view taken along line I-I' in FIG. 2A.

Referring to FIG. 2A, region A of the semiconductor device 10 includes a plurality of pads 100, 200, and 300. The first pad 100 is used to perform a function of verifying the alignment state of probes. The second pads 200 and 300 are different from the first pad 100, for example, in that they may not be used to verify the alignment state of the probes and may operate as normal pads, e.g., ones supplying electrical signals to/from one or more semiconductor elements in the semiconductor device 10.

Referring to FIG. 2B, each of the pads 100, 200, and 300 may be provided by partially exposing metal lines 410 in the semiconductor device 10. The metal lines 410 may be on a semiconductor substrate region 101 including the semiconductor elements, and may include a first metal line 411 at a relatively lower portion and a second metal line 412 on the first metal line 411. An insulating protective layer 420 may be on the metal lines 410, and the pads 100, 200, and 300 may be formed by partially exposing the metal lines 410 through openings 421, 422, and 423, which are formed by partially removing the protective layer 420. As illustrated in FIG. 2B, the protective layer 420 is partially removed from the opening 421 to partially expose the metal lines 410.

The first pad 100 may include a contact area 110 and a sensing area 120. The contact area 110 is electrically connected to the metal lines 410. The sensing area 120 is electrically isolated from the contact area 110 and is disposed around the contact area 110. The sensing area 120 may be adjacent to an edge of the opening 421. At least a portion of the sensing area 120 may be covered by the protective layer 420 without being exposed by the opening 421, as illustrated, for example, in FIGS. 2A and 2B.

The contact area 110 may include a first area 111 and a second area 112. The first area 111 may have a relatively large size compared to the second area 112. The sensing area 120 may be adjacent to an edge of first area 111. The second area 112 may extend from an edge of the first area 111 and may electrically connect the contact area 110 to the metal lines 410. In the exemplary embodiment of FIG. 2A, the first area 111 has a tetragonal shape. The first area 111 may have a different shape in another embodiment. In one embodiment, a plurality of second areas 112 may extend from edges of the first area 111 that oppose each other and in directions different from each other.

The sensing area 120 may be electrically connected to the first metal line 411, at a relatively lower level, through a plurality of vias 150. The sensing area 120 may be connected to a switching circuit having at least one switching device via the first metal line 411. The switching circuit may be connected to a first circuit and a second circuit. In some exemplary embodiments, the first circuit may detect the alignment state of a probe The second circuit may provide one or more electrical signals to semiconductor devices or circuits in the semiconductor device 10. The switching circuit may be electrically connected to the contact area 110, for example, through the metal lines 410.

Based on operation of the switching circuit, the first pad 100 may be connected to the first circuit and may function as a sensor pad for verifying the alignment state of the probe and may be connected to the second circuit to function as a normal pad for providing electrical signals to/from the semiconductor devices or circuits of the semiconductor device 10. In other words, the first pad 100 may function as both a sensor pad and a normal pad in order to alleviate the need for a specialized sensor pad that only functions as a sensor pad.

The second and third pads 200 and 300 operate as normal pads for supplying electrical signals to the semiconductor devices or circuits of the semiconductor device 10. The second and third pads 200 and 300 may have a shape that fills the openings 422 and 423 from which the protective layer 420 has been removed. Normal pads, such as the second and third pads 200 and 300, may be connected to a lower metal line by a via 250, or may be directly connected to the second metal line 412 at an edge of the opening 423. The number and shape of the second and third pads 200 and 300 may vary in different embodiments.

Figure 3:
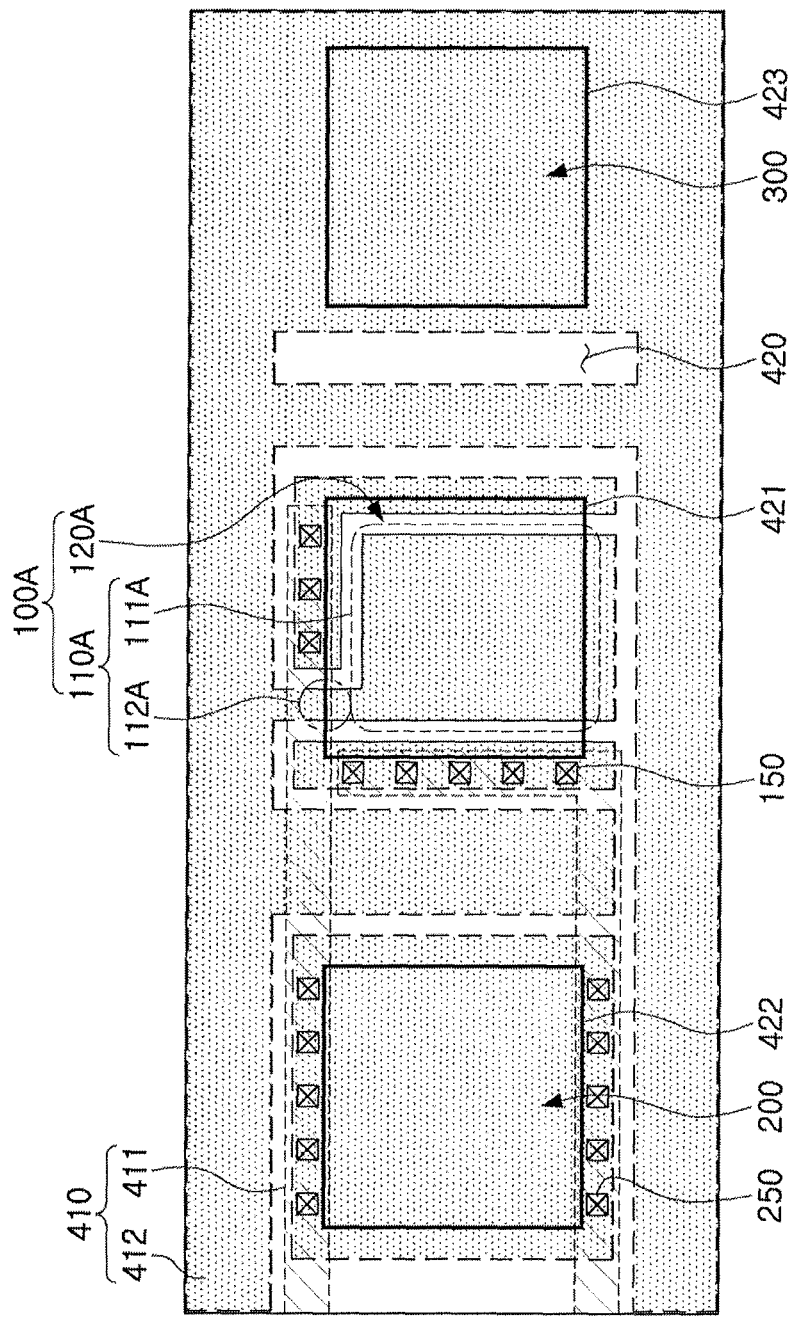
FIG. 3 illustrates another embodiment of one or more pad areas.

FIG. 3 is a partially enlarged view illustrating another embodiment of the pad areas of the semiconductor device 10. Referring to FIG. 3, a first pad 100A may have a different shape from those in FIGS. 2A and 2B. In the first pad 100A, a contact area 110A may include a first area 111A and a second area 112A. At least a portion of the first area 111A may be covered by a protective layer 420 without being exposed by an opening 421. The second area 112A may be provided as one area, and a sensing area 120A may be adjacent to an edge portion of the first area 111A.

Like the exemplary embodiment in FIGS. 2A and 2B, the contact area 110A may be electrically connected to the second metal line 412 through the second area 112A. The sensing area 120A may be electrically connected to the first metal line 411 through vias 150. The contact area 110A and the sensing area 120A may be electrically connected to or separated from each other by the switching circuit, which has at least one switching device. Whether the contact area 110A is connected to or separated from the sensing area 120A may be determined, for example, according to whether or not probes are accurately aligned with the pads 100, 200, and 300.

Figure 4:
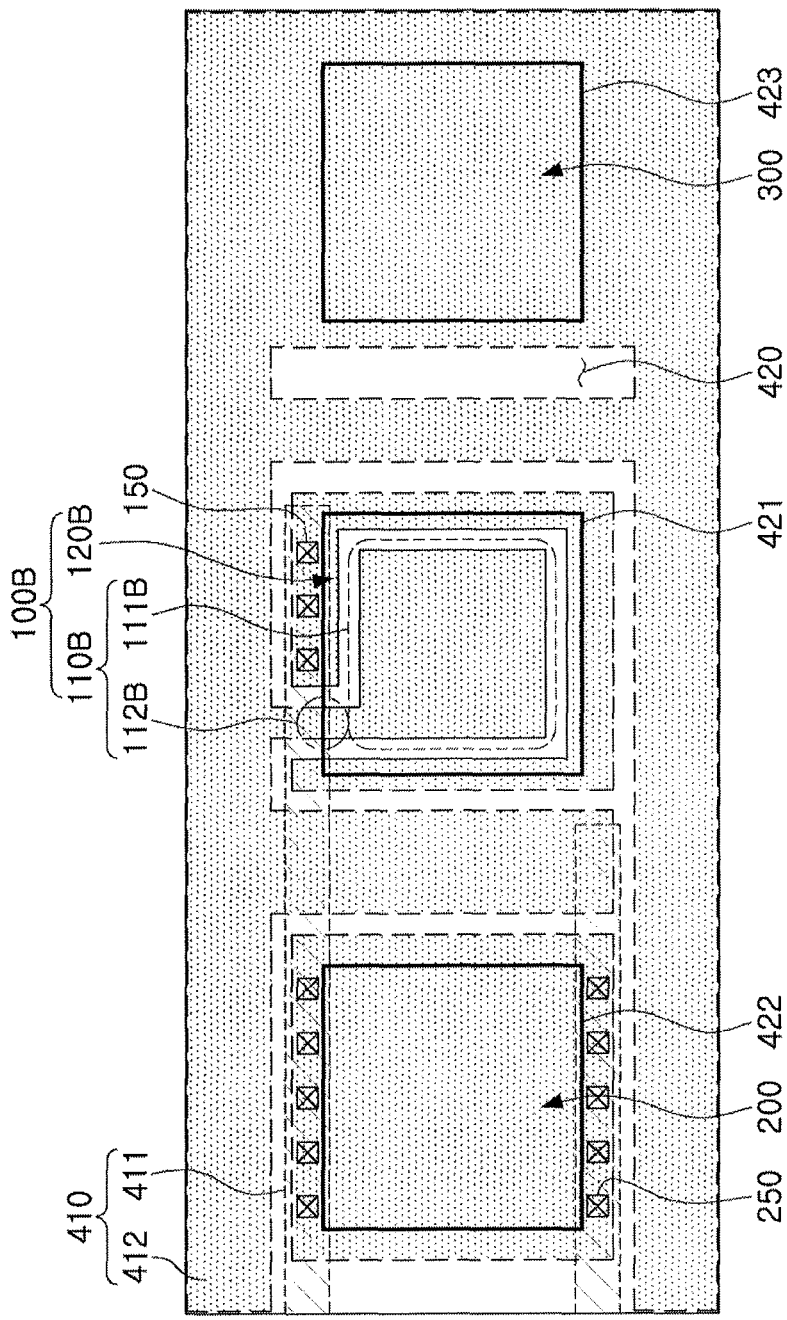
FIG. 4 illustrates another embodiment of one or more pad areas.

FIG. 4 is a partially enlarged view illustrating another embodiment of the pad areas of the semiconductor device 10. Referring to FIG. 4, a first pad 100B may have a different shape from those in FIGS. 2A and 2B and FIG. 3. In the first pad 100B, a contact area 110B may include a first area 111B and a second area 112B, and the entire first area 111B may be exposed by the opening 421. The second area 112B may be provided as one area extending from an edge of the first area 111B. A sensing area 120B may surround edges of the first area 111B without being in contact with the second area 112B. For example, the sensing area 120B may be provided as one area in the exemplary embodiments of FIG. 4, unlike the sensing areas 120 and 120A which are provided as separated areas in FIGS. 2A and 2B and FIG. 3.

Similar to the exemplary embodiments of FIGS. 2A and 2B and FIG. 3, the sensing area 120B may be connected to a first metal line 411 disposed therebelow through vias 150. The contact area 110B may be connected to the second metal line 412 disposed thereon through the second area 112B. A switching circuit may be connected between the sensing area 120B and the contact area 110B. Depending on operations of the switching circuit, the first pad 100B may be operated as one of a sensor pad for detecting an alignment state of a probe or a normal pad.

Figure 5:
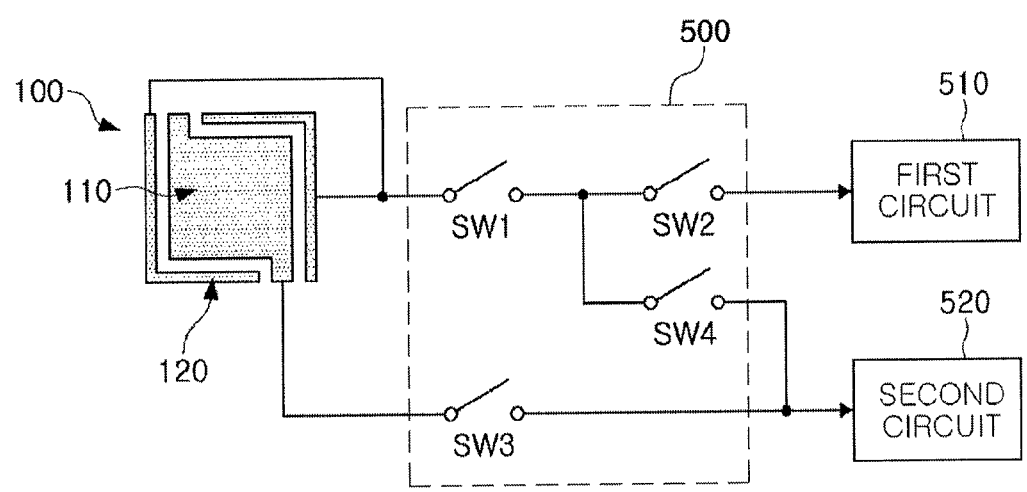
FIG. 5 illustrates an embodiment of a circuit to verify a probe alignment state.

FIG. 5 illustrates an embodiment of a circuit for verifying the alignment state of a probe in a semiconductor device, which, for example, may be any of the embodiments of the semiconductor device previously discussed.

Referring to FIG. 5, the circuit includes a switching circuit 500 having a plurality of switching devices SW1 to SW4 connected to a contact area 110 and a sensing area 120. In another embodiment, the switching circuit 500 may have a different number of switches and/or a different structure for establishing a connection between a first pad 100 and first and second circuits 510 and 520 according to the alignment state of a probe.

One end of the switching circuit 500 may be connected to the first and second circuits 510 and 520. The first circuit 510 may output a predetermined verifying voltage when the probe is misaligned. The second circuit 520 may be connected to the first pad 100 to transmit an electric signal from the first pad 100 to semiconductor devices when the probe is accurately aligned, at least to within a predetermined tolerance.

In some exemplary embodiments, when the probe is in contact with the first pad 100, first and second switches SW1 and SW2 are turned on and third and fourth switches are turned off in order to determine whether the probe is accurately aligned or not. Accordingly, the first circuit 510 may be electrically connected to the sensing area 120 of the first pad 100 via the switching circuit 500.

When the probe is determined to be accurately aligned with the first pad 100, the second switch SW2 is turned off and the other first, third, and fourth switches SW1, SW3, and SW4 are turned on. Accordingly, the contact area 110 and the sensing area 120 may be connected to the second circuit 520, and an electrical signal supplied to the first pad 100 may be transmitted to the second circuit 520 and other circuits of the semiconductor device.

Figure 6:
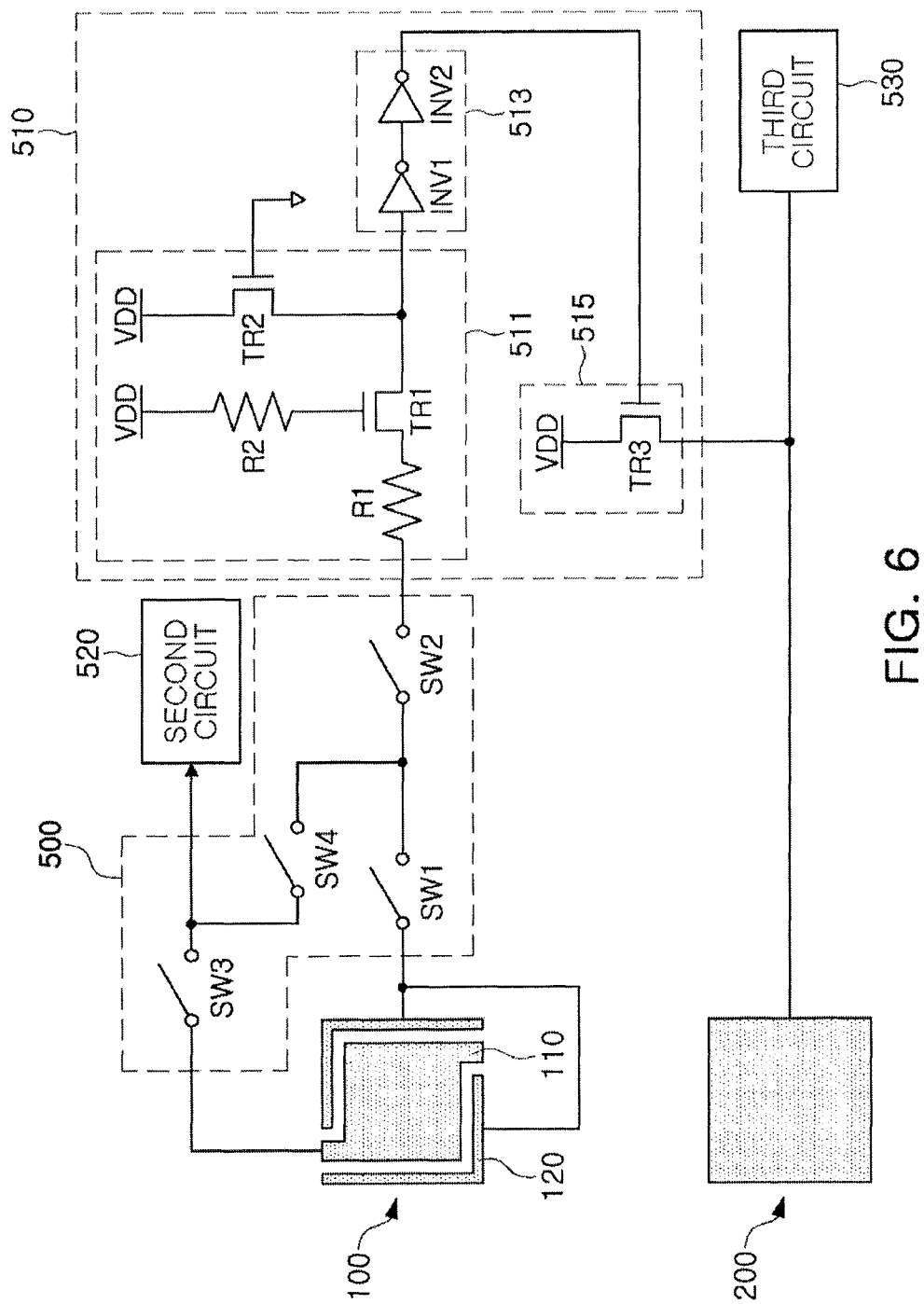
FIG. 6 illustrates another embodiment of a circuit to verify a probe alignment state.

FIG. 6 illustrates an embodiment of a circuit for verifying the alignment state of a probe in a semiconductor device, which, for example, may be any of the embodiments of the semiconductor device previously discussed.

Referring to FIG. 6, the first circuit 510 may include an input circuit 511, an inverter circuit 513, and an output circuit 515. The input circuit 511 may include resistors R1 and R2 and switching devices TR1 and TR2. The inverter circuit 513 may include a plurality of inverters INV1 and INV2. The output circuit 515 may include a switch TR3, an output of which is electrically connected to a second pad 200.

In order to verify the alignment state of a probe, a ground voltage VSS may be supplied through the probe after the probe contacts the first pad 100. The switching circuit 500 may turn the first and second switches SW1 and SW2 on, turn the third and fourth switches SW3 and SW4 off. Therefore, if the probe is misaligned and in contact with the sensing area 120, the ground voltage VSS is transmitted to the first circuit 510.

When the ground voltage VSS is transmitted to the first circuit 510 from the sensing area 120, the inverter circuit 513 may output a low signal. In response to the output of the inverter circuit 513, the switching device TR3 of the output circuit 515 may be turned on and a supply voltage VDD is detected from the second pad 200. Thus, if the supply voltage VDD is detected in the second pad 200 when the ground voltage VSS is supplied to the first pad 100, the probe may be determined to be misaligned.

On the other hand, if the supply voltage VDD is not detected in the second pad 200 when the ground voltage VSS is supplied to the first pad 100 and the first and second switches SW1 and SW2 are turned on, the probe is determined to be accurately aligned. When the probe is determined to be accurately aligned, the first, third, and fourth switches SW1, SW3, and SW4 of the switching circuit 500, except the second switch SW2, are turned on and the contact area 110 and the sensing area 120 of the first pad 100 may be electrically connected to each other.

Next, an electrical signal from the probe, which is in contact with the first pad 100, may be transmitted to the second circuit 520. After the first pad 100 is used for detecting the alignment state of the probe, the first pad 100 may be used as a normal pad for supplying electrical signals such as the second pad 200. In the embodiments of FIGS. 5 and 6, a controller may be used to control switching of the switches.

Figure 7:
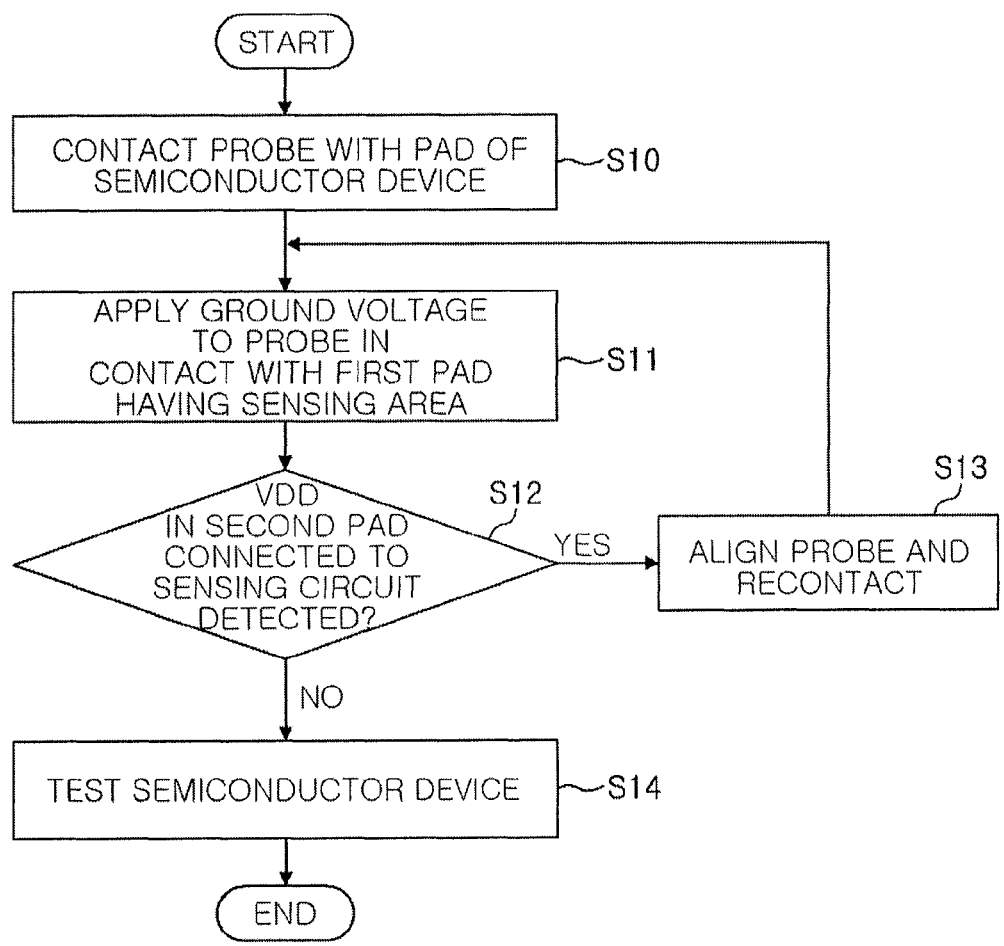
FIG. 7 illustrates an embodiment of a method to verify a probe alignment state.

FIG. 7 illustrates an embodiment of a method for verifying the alignment state of a probe in a semiconductor device, which, for example, may correspond to any of the aforementioned embodiments of the semiconductor device 10.

First, in order to detect the alignment state of a probe of a test device, the probe may be brought into contact with pads 100, 200, and 300 of a semiconductor device (S10). When the probe is in contact with the pads 100, 200, and 300 of the semiconductor device 10, the test device may supply a predetermined voltage (e.g., a ground voltage VSS or another voltage) through the probe which is in contact with a first pad 100 including the sensing area 120 (S11). For example, the ground voltage VSS may be supplied to the first pad 100. A switching circuit 500 is electrically connected to the first pad 100. The first and second switches SW1 and SW2 may be turned on and the third and fourth switches SW3 and SW4 may be turned off, for example, by a controller. In this case, the first pad 100 may be operated in a sensing mode for detecting the alignment state of the probe. The states of the switches may be controlled, for example, by a controller.

When the ground voltage VSS is supplied to the first pad 100, the test device may determine whether the supply voltage VDD is detected from a second pad 200 connected to a sensing circuit (e.g., the first circuit 510 in FIGS. 5 and 6) connected to the sensing area 120 (S12). As described above, when the probe is in contact with the sensing area 120 (e.g., when the probe is misaligned), a supply voltage VDD may be detected in the second pad 200.

As a result of process operation S12, when the supply voltage VDD is detected in the second pad 200, the test device may rearrange the position of the probe and allow the probe to re-contact the semiconductor device 10 (S13). The process of verifying the alignment state of the probe, including the process operations S11 and S12, may then be repeated until it is determined that the probe is accurately aligned.

As a result of the process operation S12, when the supply voltage VDD is not detected in the second pad 200, the test device may determine the probe to be accurately aligned and proceed to test the semiconductor device 10 (S14). While performing the test of the semiconductor device 10, the first, third, and fourth switches SW1, SW3, and SW4 of the switching circuit 500 connected to the first pad 100, except the second switch SW2, may be turned on and the sensing area 120 may be electrically connected to the contact area 110. Accordingly, the overall area of the first pad 100 may function as a normal pad, like the other pads, e.g., like the second and third pads 200 and 300.

Figure 8:
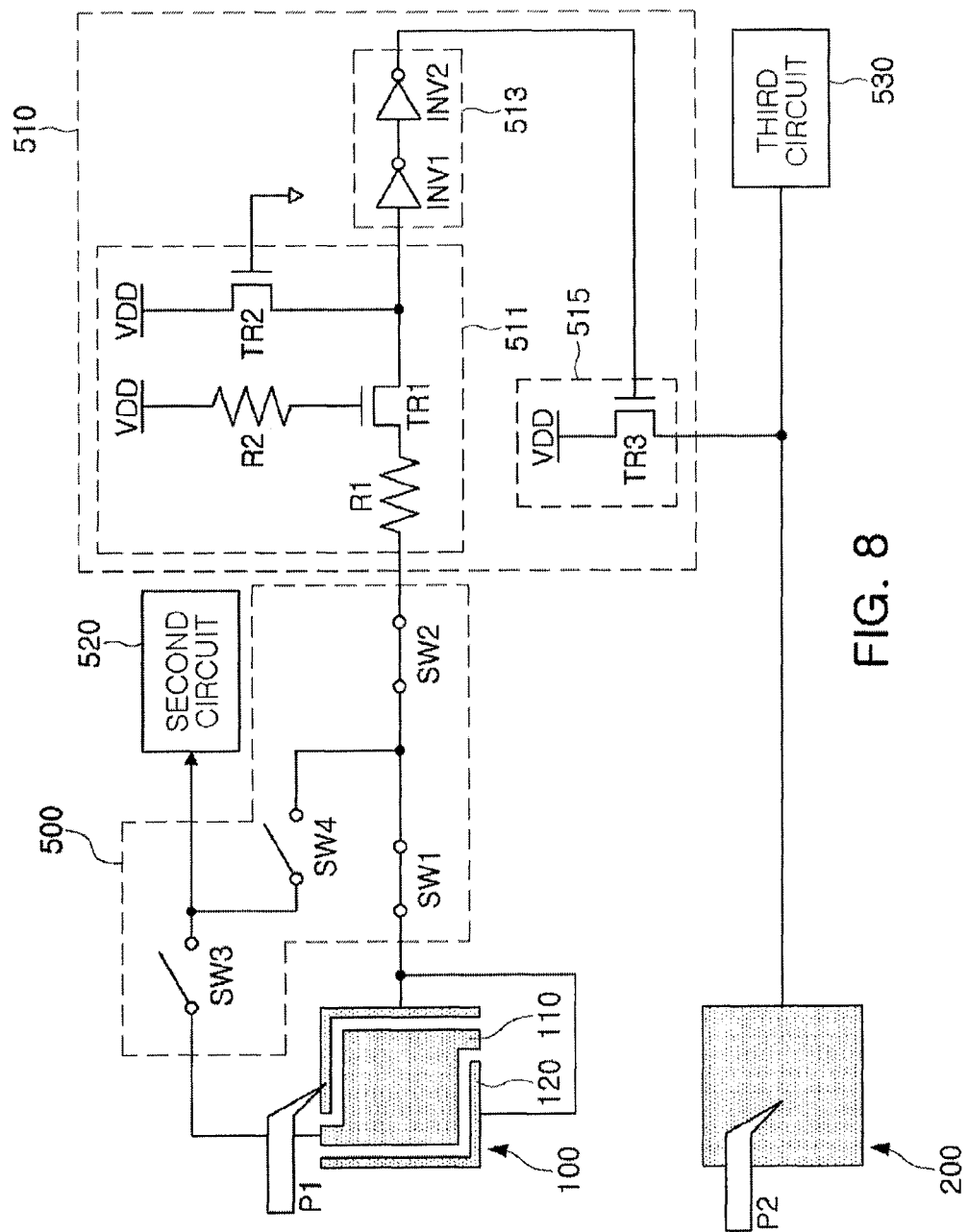
FIGS. 8-10 illustrate examples operations to verify a probe alignment state.
Figure 9:
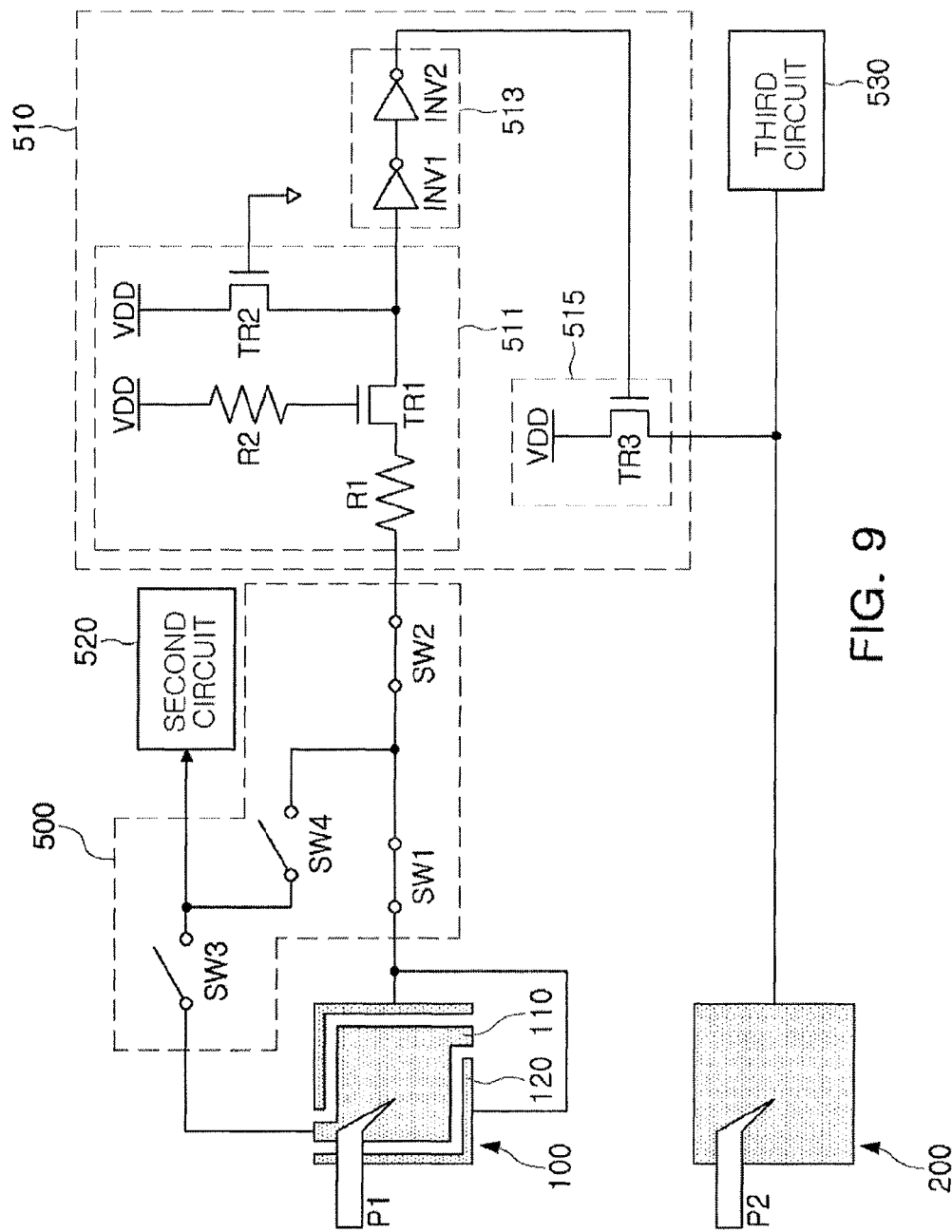
Figure 10:
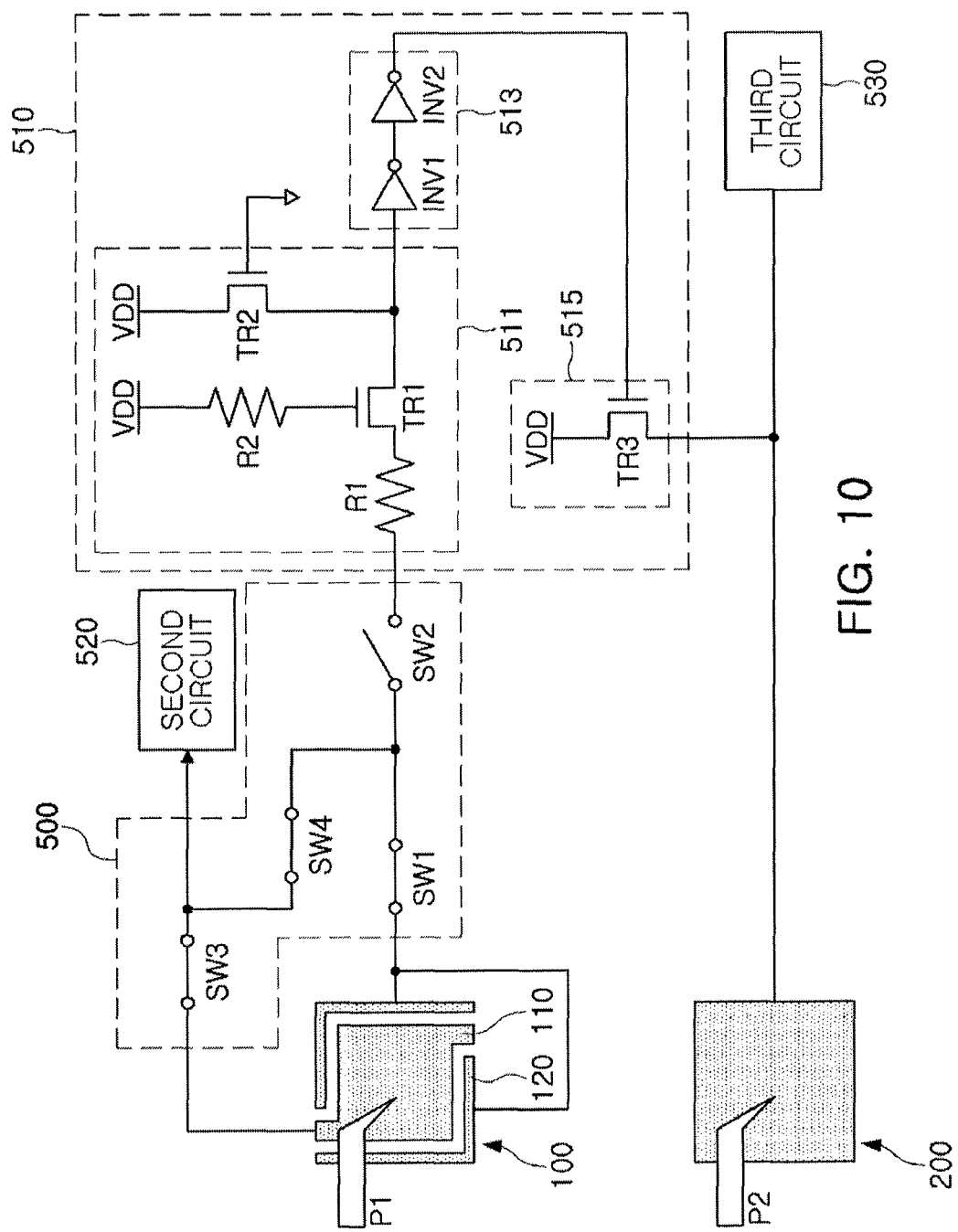

FIGS. 8 to 10 illustrate an example of operations performed by a circuit (e.g., the circuit in FIG. 6) to verify an alignment state of a probe in a semiconductor device.

First, referring to FIG. 8, a first probe P1 may be brought into contact with a first pad 100 and a second probe P2 may be brought into contact with a second pad 200. The contact area 110 and sensing area 120 of the first pad 100 may be connected to the switching circuit 500, and the switching circuit 500 may be connected to the first circuit 510 and the second circuit 520. The second pad 200 may be connected to the second circuit 520 and the third circuit 530. The first circuit 510 may be a sensing circuit that is operated when the alignment state of the probe is to be detected. The second and third circuits 520 and 530 transmit electrical signals, respectively received via the first and second pads 100 and 200, to one or more internal circuit and/or devices of the semiconductor device 10.

When the first and second probes P1 and P2 are respectively in contact with the first and second pads 100 and 200, the switching circuit 500 may turn on the first and second switches SW1 and SW2 and may turn off the third and fourth switches SW3 and SW4. Accordingly, an electrical signal supplied from the first probe P1, which is in contact with the first pad 100, may be transmitted to the first circuit 510 and may not be transmitted to the second circuit 520. When only the first probe P1 is in contact with the sensing area 120, the electrical signal supplied via the first probe P1 may be transmitted to the first circuit 510. For example, when the first probe P1 is in contact with the contact area 110, the electrical signal supplied via the first probe P1 may not be transmitted anywhere.

When the probes P1 and P2 of the test device are in contact with the semiconductor device 10, a predetermined (e.g., ground) voltage VSS may be provided via the first probe P1 in contact with the first pad 100. When the first probe P1 is in contact with the sensing area 120 of the first pad 100, the ground voltage VSS is transmitted to the first circuit 510, and the supply voltage VDD is detected from the second pad 200 by the output circuit 515. For example, when the ground voltage VSS is supplied via the first probe P1 and the supply voltage VDD is detected from the second probe P2, the test device may determine that the first probe P1 is in contact with the sensing area 120, e.g., the probes P1 and P2 are misaligned.

Unlike the exemplary embodiment of FIG. 8, when the first probe P1 is in contact with the contact area 110 of the first pad 100, the supply voltage VDD may not be detected from the second probe P2, even when the ground voltage VSS is supplied via the first probe P1.

Referring to FIG. 9, when the ground voltage VSS is supplied via the first probe P1 in contact with the contact area 110, the ground voltage VSS may not be transmitted to the first circuit 510 since the contact area 110 is not connected to the first circuit 510. Accordingly, the supply voltage VDD is not detected from the second probe P2 in contact with the second pad 200, and the test device may determine that the probes P1 and P2 are accurately aligned.

When the probes P1 and P2 are determined as being accurately aligned, the switching circuit 500 may turn on the first, third, and fourth switches SW1, SW3, and SW4, except for the second switch SW2.

Referring to FIG. 10, the first, third, and fourth switches SW1, SW3, and SW4 are turned on, and the contact area 110 may be electrically connected to the sensing area 120. In addition, both the contact area 110 and the sensing area 120 may be connected to the second circuit 520 and isolated from the first circuit 510.

Accordingly, when the first probe P1 is in contact with the contact area 110 or the sensing area 120, the electrical signal supplied via the first probe P1 may only be transmitted to the second circuit 520. The second circuit 520 may be a circuit configured to transmit an electrical signal supplied to the first pad 100 to an internal device of the semiconductor device 10. Since the electrical signal supplied via the first probe P1 is transmitted to the internal device of the semiconductor device 10 via the first pad 100 and the second circuit 520, the entire area of the first pad 100 may function as a normal pad, like the other pads. Thus, the first pad 100 may function as a sensor pad for verifying the alignment state of the probe and a normal pad for supplying an electrical signal.

Figure 11:
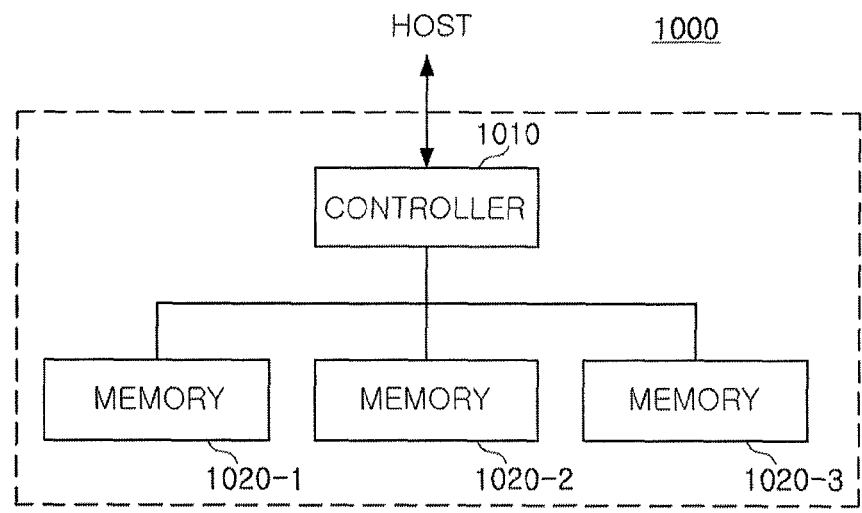
FIG. 11 illustrate an embodiment of an electronic apparatus.

FIG. 11 illustrates an embodiment of an electronic apparatus 1000 which includes one or more memory devices. Referring to FIG. 11, the electronic apparatus 1000 may be or include a storage apparatus and may include a controller 1010 for communicating with a host HOST and memories 1020-1, 1020-2, and 1020-3 for storing data. Each of the memories 1020-1, 1020-2, and 1020-3 may include the semiconductor devices one or more of the embodiments described herein.

The host HOST that communicates with the controller 1010 may be a variety of electronic devices in which the storage apparatus 1000 is installed. Examples include a smartphone, a digital camera, a desktop PC, a laptop computer, or a media player. The controller 1010 may receive a request for data reading or writing from the host HOST and generate a command CMD for writing data to the memories 1020-1, 1020-2, and 1020-3 or reading data from the memories 1020-1, 1020-2, and 1020-3.

As illustrated in FIG. 11, one or more memories 1020-1, 1020-2, and 1020-3 may be connected, in parallel, to the controller 1010 in the storage apparatus 1000. By connecting the memories 1020-1, 1020-2, and 1020-3 to the controller 1010 in parallel, the storage device 1000 may be implemented to have a large capacity, e.g., a solid state drive (SSD).

Figure 12:
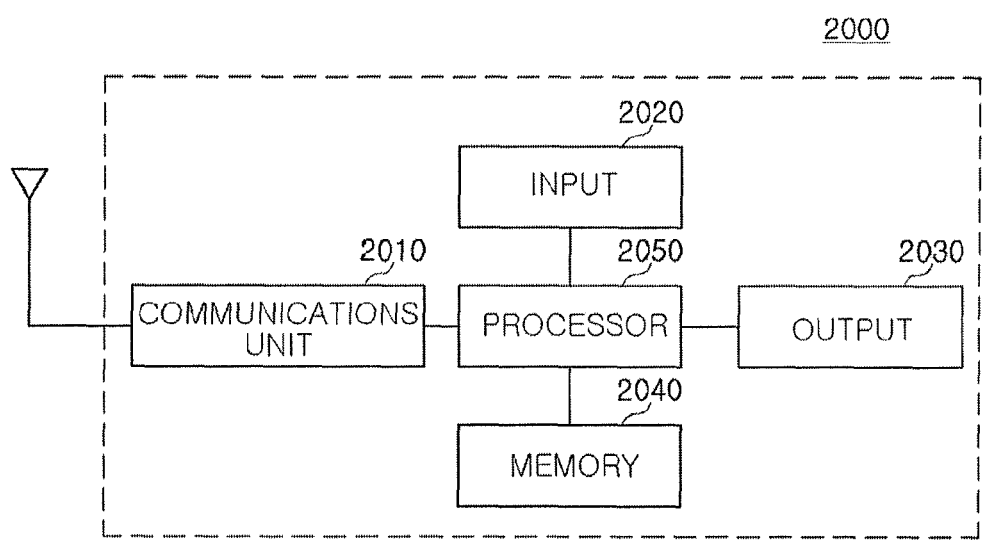
FIG. 12 illustrates another embodiment of an electronic apparatus.

FIG. 12 illustrates an embodiment of an electronic apparatus 2000 which includes one or more memory devices. Referring to FIG. 12, the electronic device 2000 may include a communications unit 2010, an input 2020, an output 2030, a memory 2040, and a processor 2050.

The communications unit 2010 may include a wired/wireless communications module. e.g., a wireless internet module, a short-range communications module, a GPS module, or a mobile communications module. The wired/wireless communications module in the communications unit 2010 may be connected to an external communications network using a variety of communications standards for transmitting and receiving data.

The input 2020 is a module which, for example, may be responsive to a user for controlling operations of the electronic device 2000. The input 2020 may include, for example, a mechanical switch, a touchscreen, a voice recognition module, or the like. Additionally, or alternatively, the input 2020 may include a trackball, a laser pointer mouse, or a finger mouse, and, for example, may further include a variety of sensor modules for allowing a user to input data.

The output 2030 may output information processed by the electronic device 2000, for example, in audio or video form. The memory 2040 may store a program for processing or controlling the processor 2050, data, or the like. The processor 2050 may write data or read data by transmitting a command to the memory 2040 according to a required operation.

The memory 2040 may be embedded in the electronic device 2000 or may communicate with the processor 2050 via a separate interface. When the memory 2040 communicates with the processor 2050 via the separate interface, the processor 2050 may write data to, or read data from, the memory 2040 using a variety of interface standards, such as secure digital (SD), secure digital high capacity (SDHC), secure digital eXtended capacity (SDXC), Micro secure digital (MICRO SD), or universal serial bus (USB).

The processor 2050 may control operations of each unit in the electronic device 2000. The processor 2050, for example, may perform controlling or processing operations related to voice calls, video calls, or data communication, and/or may control or process operations for multimedia playback and management. In addition, the processor 2050 may process an input transmitted via the input 2020 from a user, and then output a result thereof via the output 2030. Further, the processor 2050 may write data required to control operations of the electronic device 2000 to the memory 2040, or read data from the memory 2040, as described above.

In accordance with one or more of the aforementioned embodiments, at least one of a plurality of pads in a semiconductor device may include a sensing area for verifying the alignment state of a probe and a contact area operated as a normal pad. Since there is no specialized pad that only performs as a sensor pad, that is, because the sensor pad operates as both a sensor pad and a normal pad, the degree of integration of the semiconductor device may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments as set forth in the following claims.

What is claimed is:

1. A semiconductor device, comprising:
a substrate;
a plurality of semiconductor circuits on the substrate;
a plurality of metal lines electrically connected to at least one of the semiconductor circuits;
a protective layer on the metal lines and including a plurality of open areas partially exposing the metal lines to provide a plurality of pads;
a switching circuit connected to first pad; and
first and second circuits connected to the switching circuit, wherein the first pad includes a first area that extends from at least one of the metal lines and at least one second area around and separated from the first area and wherein an output node of the first circuit is connected to a second pad different from the first pad.

2. The semiconductor device as claimed in claim 1, wherein the first circuit is to output a verifying voltage to the second pad in order to verify an alignment state of probes in contact with the first and second pads, respectively.

3. The semiconductor device as claimed in claim 1, wherein the switching circuit is to transmit a voltage supplied to the first pad to the first circuit when a probe is in contact with the first pad.

4. The semiconductor device as claimed in claim 3, wherein the switching circuit is to transmit the voltage supplied to the first pad to the second circuit when a predetermined reference voltage is not detected from the second pad when the switching circuit transmits the voltage supplied to the first pad to the first circuit.

5. A semiconductor device, comprising:
a substrate;
a plurality of memory cells including:
channel areas extending in a direction crossing an upper surface of the substrate, and
a plurality of gate electrode layers stacked on the substrate adjacent to the channel areas;
a plurality of circuits around the memory cells;
a plurality of metal lines electrically connected to at least a portion of the memory cells, channel areas, or the circuits; and
a protective layer on the metal lines and providing a plurality of pads, the pads corresponding to exposed portions of the metal lines, wherein the pads include a first pad having a first area connected to at least one of the metal lines and a second area around and electrically isolated from the first area.

6. The semiconductor device as claimed in claim 5, wherein:
the pads include a second pad different from the first pad, and
the second pad has a different shape from the first pad.

7. The semiconductor device as claimed in claim 5, wherein:
the metal lines include first metal lines and second metal lines on the first metal lines, and the pads are between the second metal lines.

8. The semiconductor device as claimed in claim 7, wherein the first area is electrically connected to the second metal line.

9. A semiconductor device, comprising:
   a cell region including a plurality of memory cells;
   a peripheral circuit region including a plurality of circuits to drive the memory cells; and
   a plurality of pads to supply electrical signals to the cell region and the peripheral circuit region, the pads including a first pad and a second pad having different shapes, wherein the first pad includes:
   a first area to serve as a pad to supply an electrical signal to at least one of the cell region or the peripheral circuit region, and
   a second area to serve as a sensor pad to detect an alignment state of a probe in contact with at least one of the pads.

* * * * *